United States Patent [19]
Herriot

[11] Patent Number: 4,818,873
[45] Date of Patent: Apr. 4, 1989

[54] APPARATUS FOR AUTOMATICALLY CONTROLLING THE MAGNIFICATION FACTOR OF A SCANNING ELECTRON MICROSCOPE

[75] Inventor: Glen A. Herriot, Nepean, Canada

[73] Assignee: Vickers Instruments (Canada) Inc., Nepean, Canada

[21] Appl. No.: 114,741

[22] Filed: Oct. 30, 1987

[51] Int. Cl.[4] .......................................... H01J 37/256
[52] U.S. Cl. .................................. 250/310; 250/252.1
[58] Field of Search ............... 250/306, 307, 310, 311, 250/252.1 R

[56] References Cited

U.S. PATENT DOCUMENTS

| | | | |
|---|---|---|---|
| 3,156,820 | 11/1964 | Reimer | 250/307 |
| 3,757,117 | 9/1973 | Müller et al. | 250/306 |
| 4,068,381 | 1/1978 | Ballard | 250/310 |
| 4,677,296 | 6/1987 | Lischke et al. | 250/307 |

FOREIGN PATENT DOCUMENTS 0047908  8/1979  Japan ................................. 250/307

OTHER PUBLICATIONS

Seiler et al., SPIE, vol. 480, Integrated Circuit Metrology II, (1984), pp. 86–93.
National Bureau of Standards Certificate, Standard Reference Material 484d; Jul. 22, 1985.

*Primary Examiner*—Bruce C. Anderson
*Assistant Examiner*—Jack I. Berman
*Attorney, Agent, or Firm*—John A. Baker

[57] ABSTRACT

The present invention relates to an apparatus for calibrating the magnification of a scanning electron microscope. The microscope includes a generator for generating an electron beam, a scanning signal generator for producing a scanning signal and a unit for scanning the beam. The apparatus is comprised of a calibration object which has a plurality of aligned elements thereon which, when scanned by the electron beam produces a signal having a frequency which has a fundamental periodicity dependent on the spacing of the aligned elements. A detector is provided for detecting the signal and producing an output signal having a data content and the fundamental periodicity. A unit is connected to the detector for determining the fundamental periodicity of the output signal from the entire data content of the output signal. A control unit is provided for producing a desired magnification signal. A generator is connected to the unit for determining the fundamental periodicity of the output signal and to the control unit for producing a correction signal which is derived from the desired magnification signal and the fundamental periodicity of the output signal. A combiner is connected to the generator and the unit for scanning the beam for combining the correction signal and the scanning signal to produce a modified scanning signal which scans the electron beam to produce the desired magnification of the scanning electron microscope.

9 Claims, 2 Drawing Sheets

APPARATUS FOR AUTOMATICALLY CONTROLLING THE MAGNIFICATION FACTOR OF A SCANNING ELECTRON MICROSCOPE

The present invention provides an apparatus which controls the magnification factor of a scanning electron microscope to a high degree of accuracy.

Prior art methods of calibrating the magnification of a microscope image used the size of a calibration artifact in the field of view.

The simplest type of object is a rectangular feature. The length or width of the artifact is known and the apparent size of the image of the object is used to standardize the magnification. The distance from the left to the right edge of the image of the object is compared to the known dimensions of the object and a scale factor, i.e., a magnification factor, is calculated.

The difficulties with this type of calibration are twofold. The first difficulty is producing a microscopic object having an accurately controlled length. The second difficulty is determining what part of the image actually corresponds to the boundaries of the object.

Microfabrication techniques typically rely on photolithographic processes where exposure and development or etching time determines the final dimensions of the object. Furthermore, at the microscopic level, the edges of the artifact have roughness. As a result, the size of the calibration object is not well known in advance. Even if the resulting dimension could be accurately determined by independent means prior to its use in microscope calibration, the second problem remains.

In an image of the edges of a bright object on a dark background, there is a transition through a range of brightnesses, extending both brighter and darker than the average brightness of both the object and its background. A profile of brightness along a single line across the edges of a feature has a complex waveform which depends on a variety of factors.

In a light microscope at magnifications approaching the resolution limit of light optics, the edge profile varies with the relative reflectance of the object and its background, with the wavelength of the illumination, with the height and shape of the actual edge, and with the resolution, depth of field and focal length of the optical system.

In a scanning electron microscope, the profile depends on the resolution, beam energy and current, actual edge shape, and electron beam/material interaction which varies with atomic number.

With both types of microscopes, the problem is in determining where, along a complex waveform, lies the actual edge location. With the higher resolution scanning electron microscope the complete transition from background to object surface occurs over a much shorter distance so that the uncertainty is reduced by an order of magnitude. Nonetheless, any error in choosing an edge location in a line scan profile, for example by selecting some brightness threshold, will be doubled when determining the apparent length of the image of the object.

Another more reliable method of calibration is to calibrate on a pitch distance of a repeated and accurately formed set of features on an image rather than by attempting to calculate the absolute length of the object itself. In explaining this more reliable technique, it should be noted that it is harder to determine the length of an object than it is to determine the difference in the length of two objects. For the sake of argument, consider two gage blocks which have worn and bevelled edges. It is difficult to decide at which height to place a measuring tool to determine the actual length of a gage block. But, if the required measurement is actually the length difference between two similarly bevelled gage blocks, then the chosen height of the tool does not matter. In other words, if the measurement is between a right edge and a right edge then the aribrary choice of tool height has no effect as long as it is consistent for both edges.

Similarly, for brightness line profiles obtained from a microscope, i.e., such as a single line of a TV image, measurement from the edge of one object to the corresponding edge of an adjacent object avoids errors in determining precise edge location in the profile. All that is required is that a consistent criteria be used for both edges.

In addition, it is easier to fabricate such an artifact accurately, because a series of objects can be placed at a reproducible mean distance apart, but their actual dimensions may vary due to photolithographic process uncertainties. Such an object could be a diffraction grating having a plurality of parallel aligned grooves.

However, edge roughness limits the precision of the calibration. Local variations in the surface, and noise in the signal collecting process will cause uncertainty even in pitch measurements. The relative error caused by edge roughness may be reduced by pitch calibration over a distance much longer than the edge roughness. However, this method has the limitation that the edges occupy a smaller and smaller portion of the field of view. Since profiles are typically digitized for automatic edge detection, the quantizing errors grow large. In addition, the majority of the digitized waveform is not used; only the regions in the vicinity of the two edges contributes to the calibration process.

The calibration is often done on a series of equally spaced lines, so repetitive measurements on the pitch of various pairs of lines taken at different locations, both horizontally and vertically in the field of view, may be averaged to reduce the calibration uncertainty. This process is time consuming and is inefficient because the majority of each acquired profile does not contribute to the resulting measurement.

Many of the problems of accurately calibrating a scanning electron microscope are described in an article entitled "Precision Linewidth Measurement Using A Scanning Electron Microscope" by D. G. Seiler et al, SPIE Vol. 480; page 86, 1984.

The present invention overcomes these problems. If the calibration artifact is a series of equally spaced lines, whether produced by microfabrication or by a ruling process with an engine as in a diffraction grating, the controlled dimension is the periodicity of the lines.

The calibration method and apparatus according to the present invention acquires a line scan brightness profile and extracts the periodicity of the entire waveform. Some mathematical process determines the period of the repetitive lines and spacings on the entire image of the calibration artifact. Since this period in the image corresponds to a known period on the artifact, the magnification of the scanning electron microscope can be determined.

The preferred method to determine the period of the repetitive waveform such as a single line scan brightness profile across a series of lines is with a Fast Fourier Transform (FFT). The FFT technique converts a profile into a waveform with a major narrow peak corresponding to the fundamental spatial frequency of the image.

All data points, from all edges of all lines in the field of view participate in a very efficient manner. Computation is rapid and the resulting measurement is the best estimate of image periodicity in the sense that it minimizes the sum of the square of the errors due to edge roughness and random deviations from the nominal period among the various pitches in the image.

If the peak in the Fast Fourier Transform occurs at, for example, the 100th data point, counting from zero, then it means that there are 100 fundamental spatial frequency periods in the image scan line. Since the mean artifact pitch can be determined in advance by independent and by accurate means, the magnification of the image can be calculated. This calibration is faster, more repeatable, and more accurate than previously available techniques.

In accordance with an aspect of the invention there is provided apparatus for calibrating the magnification of a scanning electron microscope including means for generating an electron beam, scanning signal generating means for producing a scanning signal, and means for scanning said beam, said apparatus comprising: a calibration object which has a plurality of aligned elements thereon which, when scanned by said electron beam produce a signal having a frequency which has a fundamental periodicity dependent on the spacing of said aligned elements; detector means for detecting said signal and producing an output signal having a data content and said fundamental periodicity; means connected to said detector means for determining the fundamental periodicity of said output signal from the entire data content of the output signal; control means for producing a desired magnification signal; generating means connected to said means for determining the fundamental periodicity of said output signal and said control means for producing a correction signal which is derived from said desired magnification signal and the fundamental periodicity of said output signal; and combiner means connected to said generating means and said means for scanning said beam for combining said correction signal and said scanning signal to produce a modified scanning signal which scans said electron beam to produce the desired magnification of said scanning electron microscope.

The present invention will be described in detail hereinbelow with the aid of the accompanying drawings in which.

Figure 3:
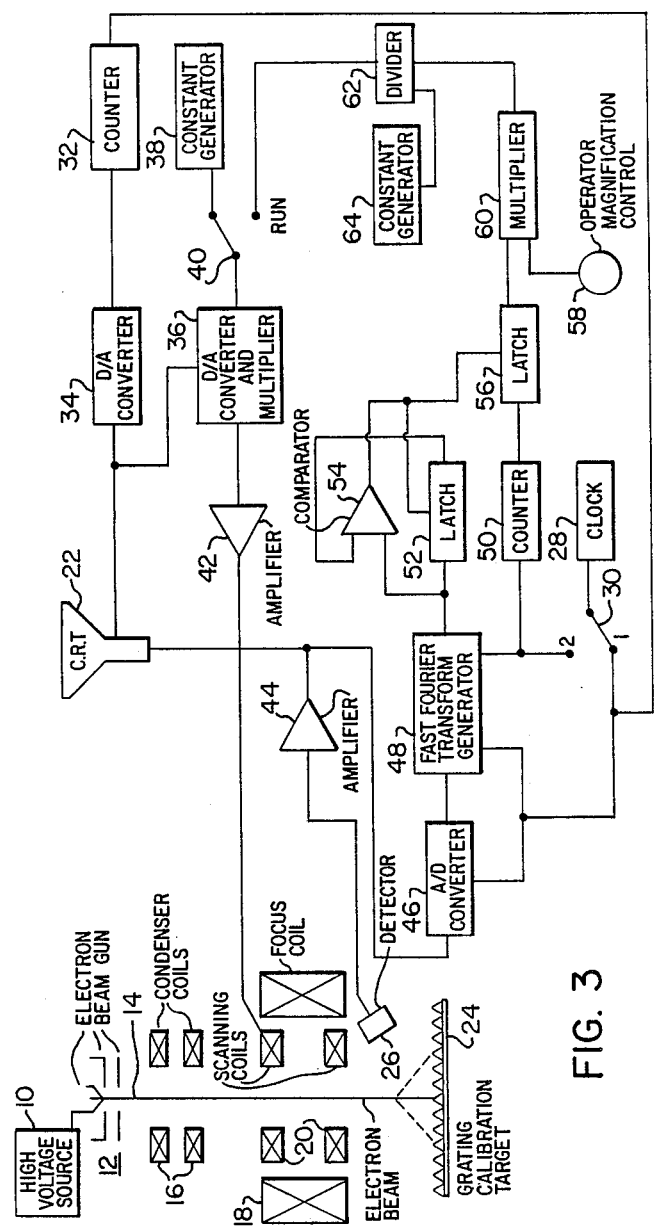
FIG. 3 is a block diagram of a particular embodiment of the present invention.

The left-hand portion of FIG. 3 is a schematic representation of a scanning electron microscope. A high voltage source 10 is connected to an electron gun 12 which produces an electron beam 14. Condensing coils 16 and focussing coils 18 concentrate the beam 14 on a target. The microscope also contains scanning coils 20 which move the electron beam across the object to be observed. If the scan width across CRT 22 is always constant then the magnification of the electron microscope can be varied by varying the amplitude of the ramp function of the scanning current driving the scanning coils 20.

Figure 1:
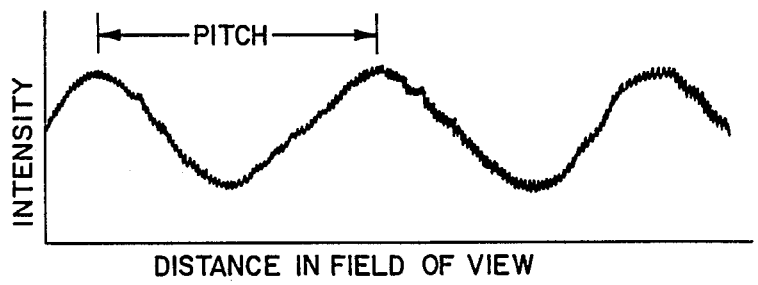
FIG. 1 is a diagram of the intensity of the detected signal from a scanning electron microscope with respect to distance scanned across a calibration grating.

The present invention provides an apparatus which accurately determines the magnification of a scanning electron microscope. To this end, a very accurately machined calibration grating 24 is mounted in the microscope adjacent the object to be examined. By using diffraction techniques the distance between each groove on grating 24 can be measured with a high degree of accuracy. If the electron beam now scans across the grooves, the number of grooves can be counted for each scan. FIG. 1 represents the voltage signal produced at the output of detector 26 of FIG. 3 for a single scan. It should be noted that the waveform is rather fuzzy and it is difficult with any degree of accuracy to determine the location of the maxima. As a result, it is difficult to accurately measure the pitch distance on the CRT 22. It would be a simple matter to determine the magnification of the microscope if this pitch distance could be determined accurately on the CRT because the actual pitch distance of the grating is known.

The present invention manipulates the signal received by detector 26 so as to eliminate this uncertainty but also produces a signal which feeds back to the scan generating circuitry of the scanning electron microscope to maintain the magnification factor set.

Clock generator 28 produces a continuous stream of clock pulses. When switch 30 is in position 1, clock generator 28 is connected to counter 32. The clock pulses are counted continuously by counter 32 and this increasing digital count is fed to digital-to-analog converter 34. The analog output of D/A counter 34 is a ramp function and drives the scan of the CRT, which, in this initial calibration mode is not important. However, the output of D/A converter 34 is fed to D/A converter and multipler 36. A digital constant generator 38 produces a digital output which ranges between 0 and 1. This contant is normally set at exactly 1. The digital constant is fed, via switch 40, to the second input of D/A converter and multiplier 36. The output of D/A converter 36 is a ramp function which has been multiplied by a factor ranging from between 0 and 1. The mixing of the outputs of devices 34 and 38 merely produce a ramp function at the output of device 36 which has about the right amplitude to drive the scanning coils 20 of the microscope via an amplifier 42.

The result of this scan drives electron beam 14 across the grooves in grating 24 to produce the signal shown in FIG. 1 at the output of detector 26.

The signal from detector 26 is amplified by amplifier 44 and is fed to both the CRT 22 and an analog-to-digital converter 46. The analog to digital converter 46 is driven at a sample rate equal to the clock rate and produces a stream of discrete numbers, each number representing an intensity value of the analog signal at each sample. For accuracy, the sample rate must be significantly higher than the frequency of the signal being digitized and the frequency of that signal is determined by the length of scan line and the pitch of the grooves on the grating 24. The output of A/D converter 46 is a digitized version of the signal shown in FIG. 1 and is therefore in the distance domain.

The output of A/D converter 46 is fed to the input of a Fast Fourier Transform generator 48. The FFT generator 48 first stores the data of one scan in a memory. The data is clocked into this memory by clock generator 28. When one scan is completed and the memory in FFT generator 48 is full, switch 30 is moved to position 2. The clock generator 28 now activates the fast fourier portion of generator 48 and a counter 50.

Figure 2:
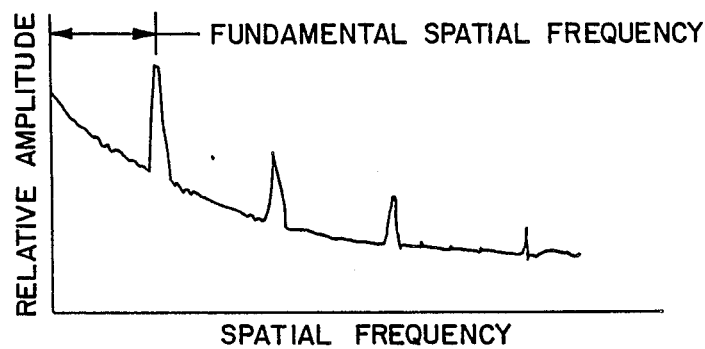
FIG. 2 is a diagram of the curve of FIG. 1 after a Fast Fourier Transform has been applied thereto.

The output of FFT generator 48 is shown in FIG. 2. The X-axis of FIG. 2 represents spatial frequency and the distance from the Y-axis to the largest peak equals the number of grooves of the grating 24 passed over in one scan of the electron beam 14.

Since the distance between the grooves on the diffraction grating is known the magnification of the microscope is known by counting the number of grooves. The distance between the Y axis and the largest peak is broken up into samples of the clock generator or pixels. Since the number of pixels per scan is high the resolution, i.e. the location of the largest peak can be determined with great accuracy. If the distance between the Y axis and the largest peak is large, the scan has traversed many grooves and the magnification of the microscope is relatively low. On the other hand, if the distance between the Y axis and the largest peak is small, the electron beam has traversed only a few grooves and the magnification of the microscope is relatively high. This, of course, is true because the horizontal axis of the CRT is always scanned across a constant distance.

The remaining circuitry shown in FIG. 3 utilizes the output of the FFT generator 48 to produce a correction signal which is combined with the scanning signal so as to correct the scanning signal to produce the desired, set, microscope magnification.

The output of FFT generator 48 represents the relative amplitude of the spatial frequencies in the sequence of data originally output from the A/D converter 46. For example, the intensity of the 30th pixel, counting from 0, at the output of FFT generator 48 represents the relative amount of a sinusoidal component at thirty cycles per scan line in the data sequence input by A/D converter 46, i.e. the fundamental sinusoid frequency of the curve shown in FIG. 1. This would represent having scanned across thirty grooves of diffraction grating 24.

The data sequence output from FFT generator 48 is shifted into a peak detector circuit formed by memory latch 52 and comparator 54. At the same time as each new pixel is presented to the peak detector circuit, the clock signal from clock generator 28 increments counter 50 the output of which is fed to memory latch 56.

If the data output from FFT generator 48 is greater than the contents of latch 52, which begins at 0, and which is output from latch 52 and fed to the second input of comparator 54, the output of comparator 54 strobes both memory latches 52 and 56 to store their inputs. As a result, latch 52 stores the count from counter 50 and latch 52 stores the latest maximum of the data from FFT generator 48. When all of the data has been shifted out of FFT generator 48, latch 52 contains the magnitude of the greatest pixel and latch 56 contains its location or pixel count from 0 in the sequence.

Since the greatest peak in the fourier transform of a periodic waveform corresponds to the fundamental spatial frequency, the contents of the latch 56 contain the period of the grating image in cycles per scan line. In other words, the output of the latch 56 is a value f of grating periods for a scan line. Latch 56 will continue to output that value until it is reset.

Once this value is obtained, switch 30 is moved back to position 1 and switch 40 is moved to the run position.

At this time, the operator sets a control 58 which is the magnification control. The output of that control is a digital number m and represents the number of pixels per micron, i.e. the desired magnification of the microscope. In this example, the number m might be 70.

Multiplier 60 multiplies the output of latch 56 with the output of control 58 and the output is fed into one input of the divider 62. The digital number f x m or, say 2100 is input, as an example.

Constant digital number generator 64 outputs a value n/p where n is the number of pixels in a scan line and p is the grating period in micrometers. For example, n can be 2000 and p=1. These two variables are set in advance of the operation of the microscope. As a result, in this example, the output of divider 62 is very nearly 1, the value of the output of constant generator 38. In our example, the output of divider 62 is 0.952. The ratio between the value of the output of divider 62 and that of the constant generator 38 is the compensation which must be made to the ramp function produced at the output of D/A converter multiplier 36 to give the corrected magnification factor to provide the magnification set by the control 58.

If we consider the value to be 0.952 as in the above example, this value gives a magnification for the scanning electron microscope of b. If it is desired to increase the magnification to exactly 2b, then the operator adjusts control 58 so that instead of the digital number 70 being output, the digital number 140 is output. The output of the divider 62 then becomes 0.476, which is the compensated value which when multiplied by the output of the D/A converter 34 produces a ramp function which scans the workpiece by only exactly ½ thereby doubling the magnification.

The circuit shown in FIG. 3 will maintain its calibration over a period of time as long as other factors such as electron beam energy, etc., remain constant.

It can be seen that a good portion of the circuitry shown in FIG. 3 manipulates digital numbers in a mathematical manner. As a result, some of the block diagram circuitry shown in FIG. 3 can be replaced by a general purpose computer programmed in the proper fashion.

I claim:

1. Apparatus for calibrating the magnification of a scanning electron microscope including means for generating an electron beam, scanning signal generating means for producing a scanning signal, and means for scanning said beam, said apparatus comprising:

a calibration object which has a plurality of aligned elements thereon which, when scanned by said electron beam produce a signal having a frequency which has a fundamental periodicity dependent on the spacing of said aligned elements;

detector means for detecting said signal and producing an analog output signal having a data content and said fundamental periodicity;

means connected to said detector means for determining the fundamental periodicity of said analog output signal from the entire data content of the analog output signal; control means for producing a desired magnification signal;

correction signal generating means connected to said means for determining the fundamental periodicity of said analog output signal and said control means for producing a final correction signal which is derived from said desired magnification signal and the fundamental periodicity of said analog output signal; and combiner means connected to said correction signal generating means and said means for scanning said beam for combining said final correction signal and said scanning signal to produce a modified scanning signal which scans said electron beam to produce the desired magnification of said scanning electron microscope.

2. The apparatus of claim 1, wherein said calibration object is a diffraction grating.

3. The apparatus of claim 1, wherein said means for determining the fundamental periodicity of said analog output signal comprises an analog-to-digital converter for producing a digital output signal and a Fast Fourier Transform generator means for producing a digital output signal which is derived form said analog output signal.

4. The apparatus of claim 3 wherein said means for determining the fundamental periodicity of said analog output signal further includes clock generator means for providing sample pulses for driving said analog-to-digital converter and said Fast Fourier Transform generator means; peak detector means for determining the largest value of said digital output signal; memory means for storing the sample number of the largest peak value, said sample number being the number of fundamental periods of said analog output signal per scan; and switch means for disabling said Fast Fourier Transform generator means once said sample number has been obtained.

5. The apparatus of claim 4 wherein the peak detector means includes a first memory unit and a comparator, said first memory unit receiving said digital output signal and being latched by said comparator to store the largest value of said digital output signal.

6. The apparatus of claim 5, wherein said means for storing the sample number of the largest peak value includes a first counter means, the input of which is connected to said clock generator means, the output of which is connected to a second memory unit which is also connected to said comparator such that when said largest value is determined by said comparator the count of said first counter means is latched into said second memory unit, said count representing the number of fundamental periods scanned in a single scan and therefore representative of the actual magnification of said scanning electron microscope.

7. The apparatus of claim 6, wherein said means for producing a scanning signal comprises said clock generator means connected to a second counter means which is connected to a digital-to-analog converter means which, in turn, is connected to a first input of a digital-to-analog converter multiplier means, the output of which is the scanning signal.

8. The apparatus of claim 7, wherein the correction signal generator means comprises a multiplier means connected to said control means and said second memory unit for producing an intermediate correction signal which is the product of said desired magnification signal and said count; a first constant number generator for producing a first constant number and a divider means, said divider means being connected to said multiplier means and said first constant number generator so as to produce said correction signal which is produced by dividing said intermediate correction signal into said first constant number.

9. The apparatus of claim 8, wherein said combiner means includes a switch which connects the output of said divider means to a second input of said digital-to-analog converter and multiplier means wherein said scanning signal is multiplexed by said final correction signal to produce said modified scanning signal.

* * * * *